United States Patent [19]
Ghilardelli

[11] Patent Number: 6,163,487
[45] Date of Patent: Dec. 19, 2000

[54] CHARGE PUMP CIRCUIT FOR INTEGRATED MEMORY DEVICES

[75] Inventor: Andrea Ghilardelli, Cinisello Balsamo-MI, Italy

[73] Assignee: STMicroelectronics S.r.l., Agrate Brianza, Italy

[21] Appl. No.: 09/378,427

[22] Filed: Aug. 20, 1999

[51] Int. Cl.[7] .................................................. G11C 11/24
[52] U.S. Cl. ...................... 365/189.09; 365/149; 327/536
[58] Field of Search ............................... 365/189.09, 149, 365/189.11; 327/534, 536, 537

[56] References Cited

U.S. PATENT DOCUMENTS

| | | | |
|---|---|---|---|
| 5,815,446 | 9/1998 | Tobita | 365/189.09 |
| 5,943,271 | 8/1999 | Fujita | 365/226 |

*Primary Examiner*—Vu A. Le
*Attorney, Agent, or Firm*—Theodore E. Galanthay; Allen, Dyer, Doppelt, Milbrath & Gilchrist, P.A.

[57] ABSTRACT

A charge pump circuit for integrated memory devices includes a plurality of stages cascade connected between an input terminal having a first voltage reference and an output terminal. Each stage includes a boost capacitor and one PMOS transistor functioning as a pass transistor. Each PMOS transistor has conduction terminals connected between the previous stage and the next stage, and a control terminal receiving a drive signal. The pass transistors are driven with a voltage that has a ground value when they are to be turned on, and a voltage equal to the highest of the positive voltages involved when they are to be turned off. The highest of the positive voltages involved is the output from the charge pump.

42 Claims, 9 Drawing Sheets

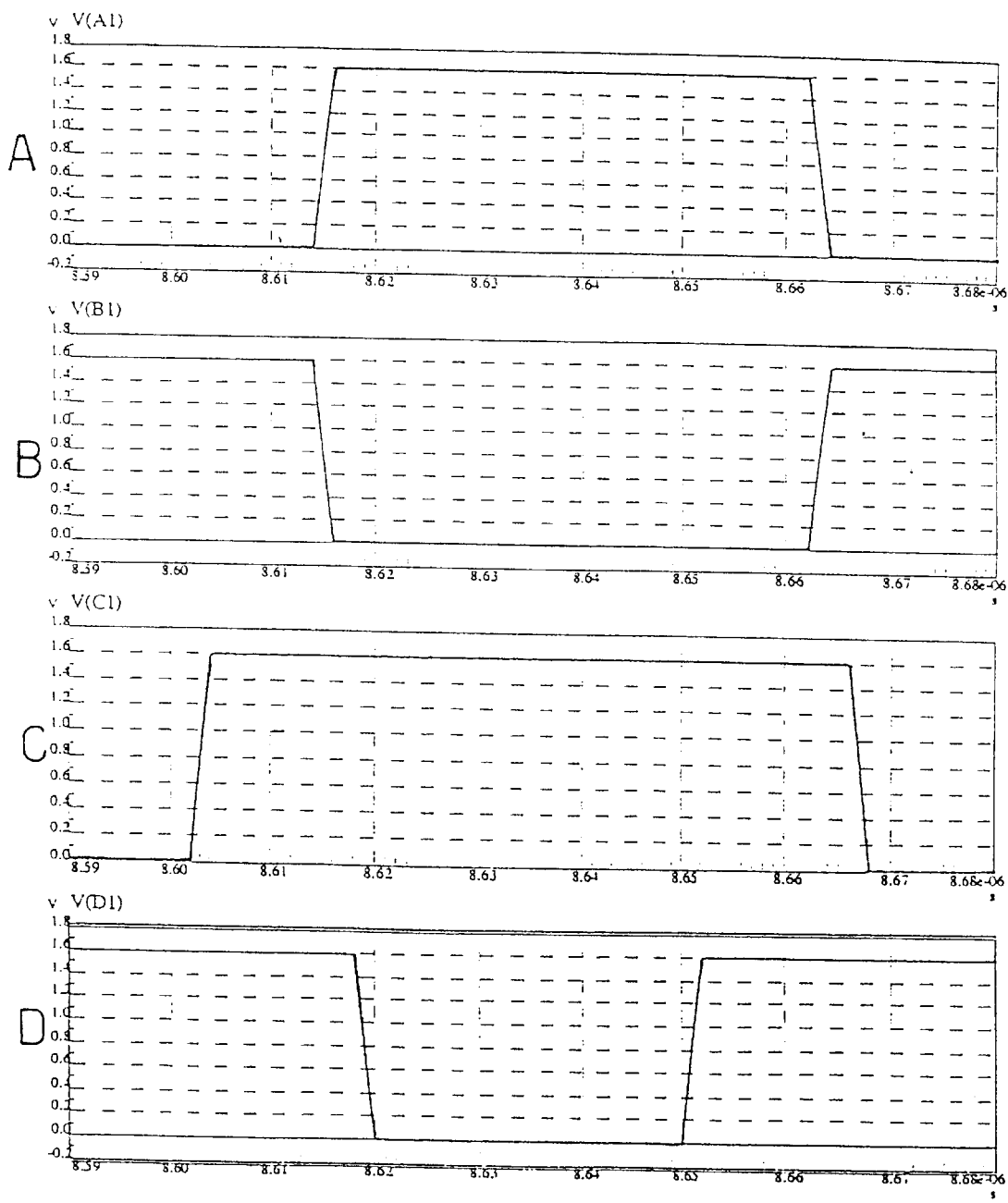

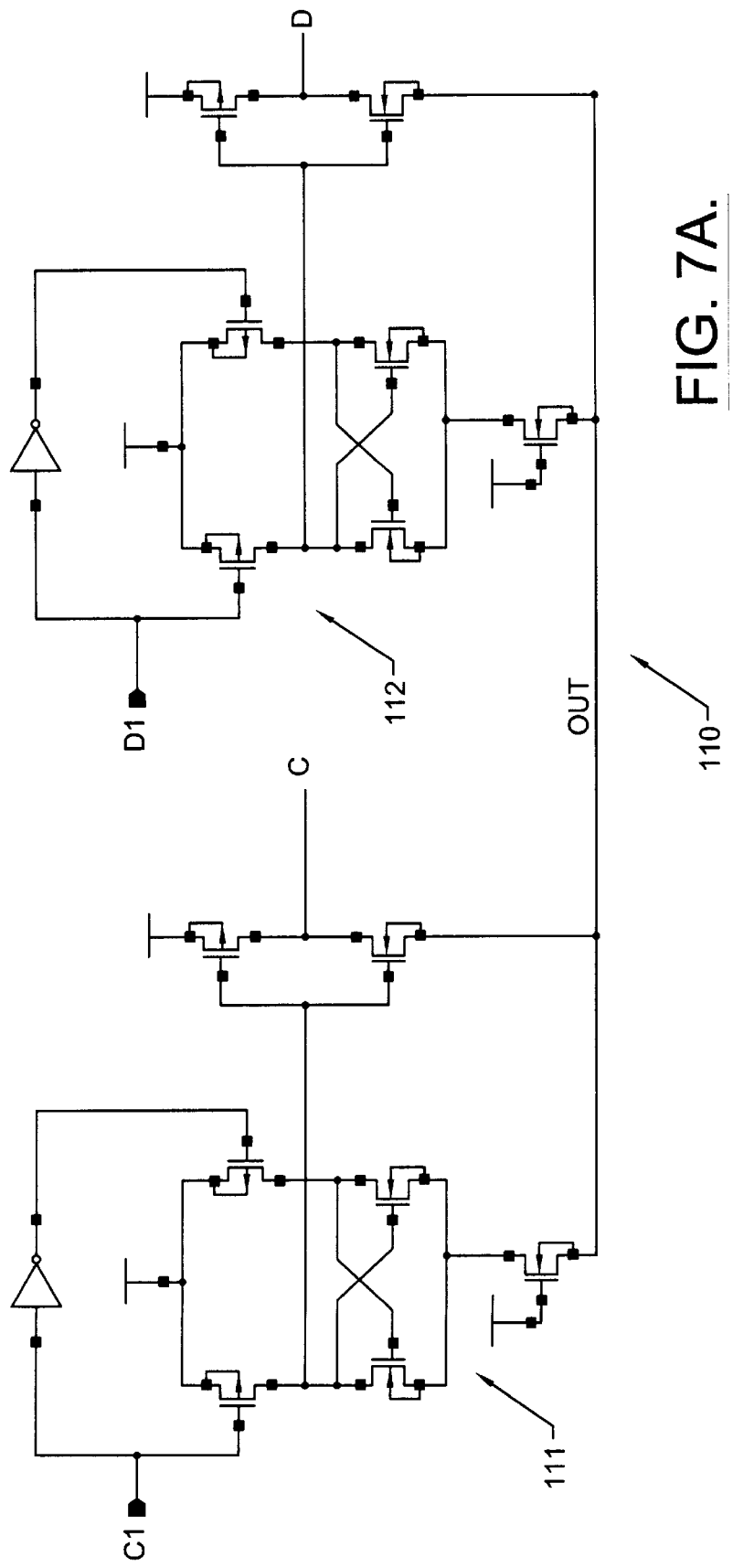

CHARGE PUMP CIRCUIT FOR INTEGRATED MEMORY DEVICES

FIELD OF THE INVENTION

The invention relates to the field of electronics, and, more particularly, to a charge pump circuit.

BACKGROUND OF THE INVENTION

It is occasionally necessary to generate a positive voltage above the supply voltage VDD in integrated memory devices being supplied with a single supply voltage. Integrated memory devices include EPROM, EEPROM and Flash memory devices, for example. When a positive voltage above the supply voltage is required, voltage boosters are used to generate the voltage. A charge pump circuit may be used as a voltage booster. However, charge pump circuits present some manufacturing difficulties, especially when they operate on very low supply voltages, e.g., less than 1.8 V.

Positive charge pumps are usually formed with NMOS transistors. This construction has a disadvantage, however, in the low voltage at which the NMOS transistors can be turned on. When VGS<VDD, this results in low transistor conductivity and, consequently, an inefficient charge pump that supplies a rather small current. Preferably, these NMOS transistors are not be driven with a voltage VGS>VDD.

This situation is aggravated by the overdrive voltage wherein the NMOS transistor can be turned on, which is always slightly less than VDD. The overdrive voltage is the difference between the gate-source voltage drop and the threshold voltage VGS−VT. This is due to the charge being shared with parasitic capacitances which oppose an ideal boost effect.

Another contribution to a depressed boost voltage is that the waveform of the phase signals that drive the capacitors have a significant finite duration. The NMOS transistors used in positive voltage boosters are also affected by the body effect. With standard process technologies, this effect cannot be suppressed. This means that a drive voltage VGS−VT=VDD−VT may be inadequate to turn on the transistors if VT>VDD. As a result, the charge pump cannot output voltages above a given value. The delivered current will be small due to the turned on transistors being able to conduct no more than a small current because of being poorly driven.

The body effect is more pronounced in the last stages of the charge pump, i.e., the stages nearest the output, because they obtain higher voltages. With triple-well process technology, wherein the bulk of the NMOS transistors can be driven at voltages other than ground voltage, the body effect can be suppressed. However, triple-well processes are expensive and not readily available.

SUMMARY OF THE INVENTION

An object of the present invention is to provide a charge pump circuit which has structural and functional features adapted for operation on very low supply voltages, and to overcome the aforementioned prior art deficiencies.

A positive charge pump uses PMOS transistors as pass transistors. The PMOS pass transistors are driven with a voltage which equals the ground value when they are to be turned on, and the highest of the positive voltages from the output OUT from the charge pump when they are to be turned off.

Based on this principle, the object of the present invention is met by a charge pump circuit as previously indicated, wherein each stage comprises a boost capacitor and one transistor whose conduction terminals are connected between the previous stage and the next stage, and whose control terminal receives a predetermined drive signal.

BRIEF DESCRIPTION OF THE DRAWINGS

The features and advantages of a charge pump circuit according to the invention will become apparent from the following description of an embodiment thereof, given by way of non-limitative examples with reference to the accompanying drawings.

FIGS. 3A, 3B, 3C and 3D are respective schematic views of voltage-vs-time plots for signals which appear in the drive circuit of FIG. 2A.

FIG. 7A is a schematic view of a drive circuit for the negative charge pump circuit of FIG. 6.

FIGS. 7B and 7C are respective schematic detail views of the drive circuit of FIG. 7A.

DETAILED DESCRIPTION OF THE PREFERRED EMBODIMENTS

Figure 1:
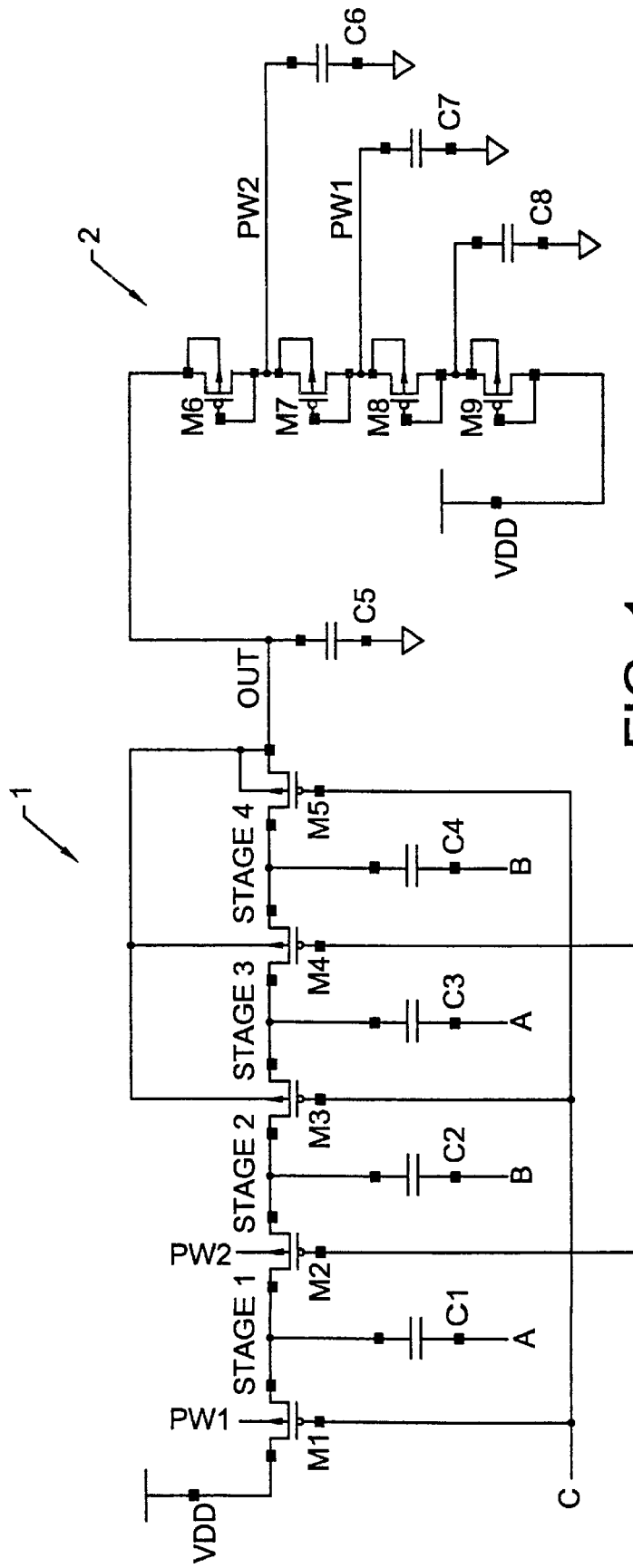
FIG. 1 is a schematic view of a positive charge pump circuit according to the present invention.
Figure 6:
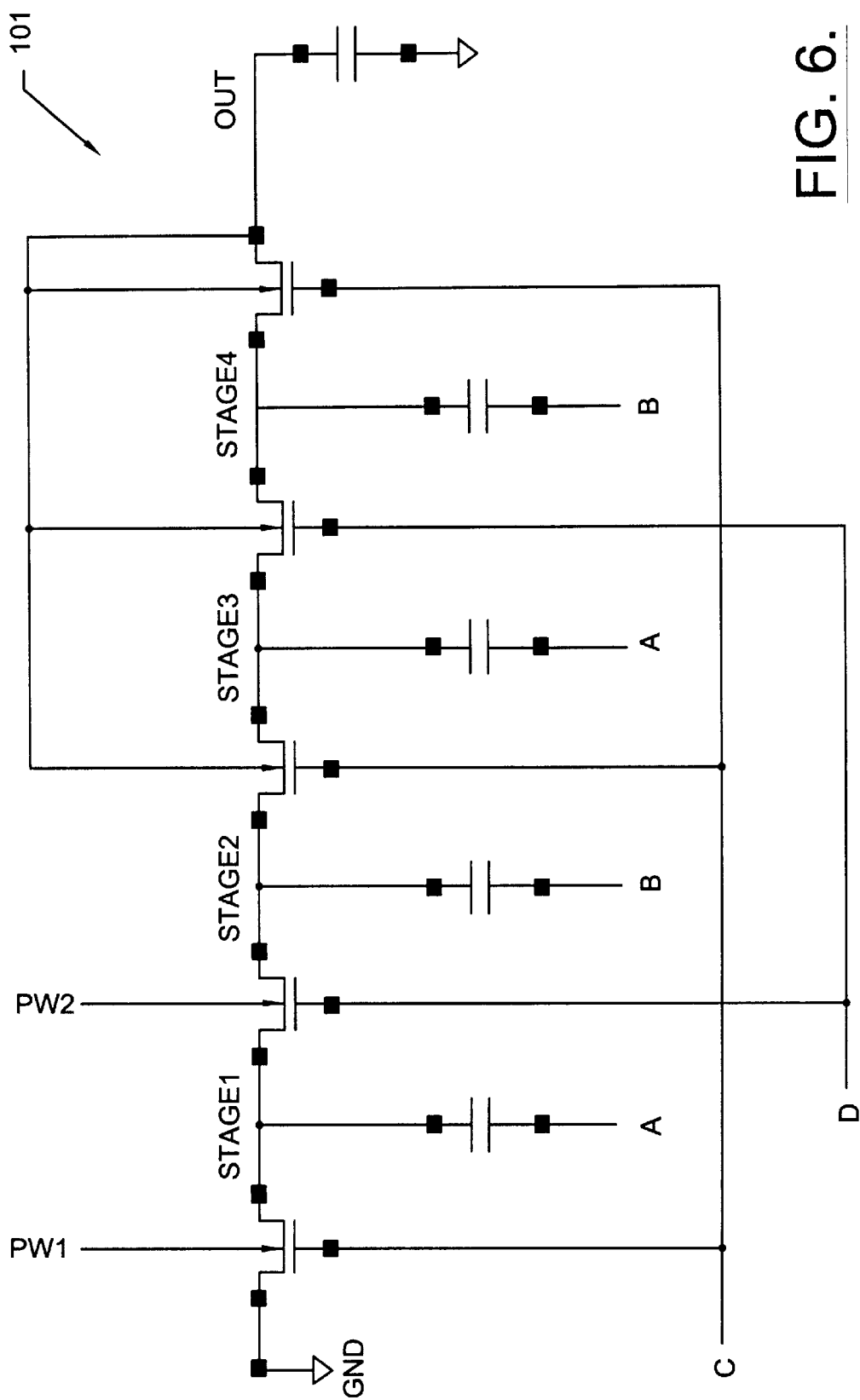
FIG. 6 is a schematic view of a modified embodiment of a negative charge pump circuit according to the present invention.
Figure 8A:
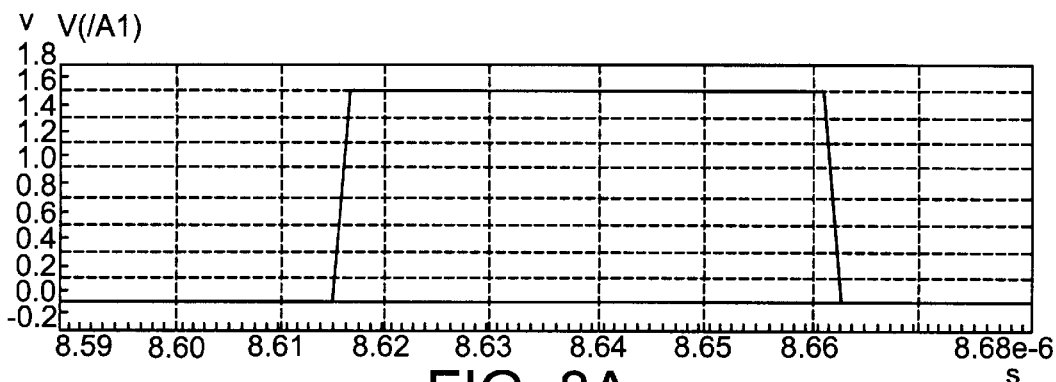
FIGS. 8A, 8B, 8C and 8D are respective schematic views of voltage-vs-time plots for signals which appear in the drive circuit of FIG. 7A.
Figure 8B:
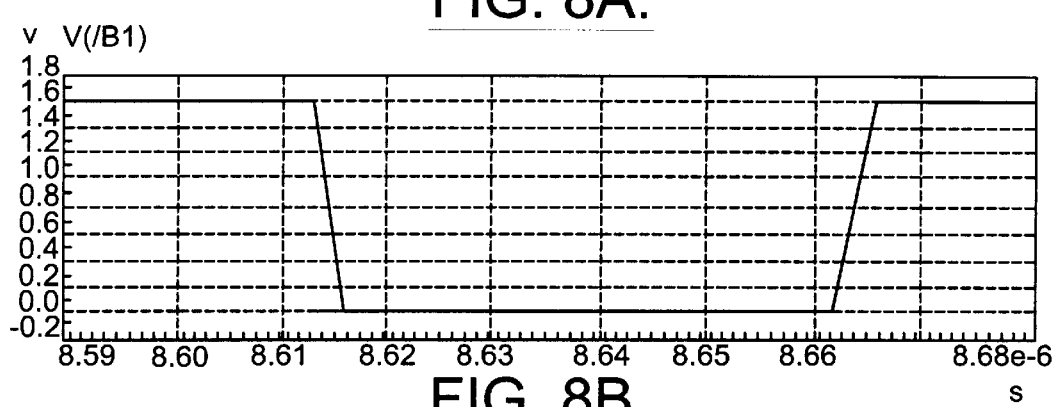
Figure 8C:
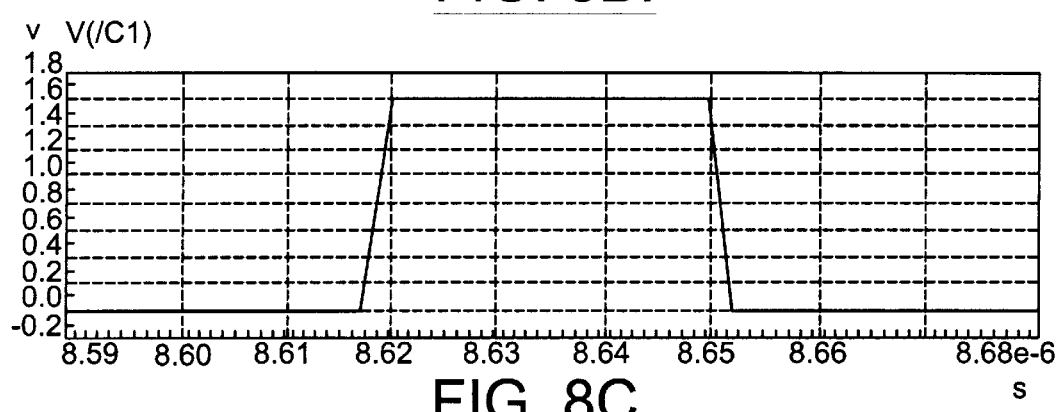
Figure 8D:
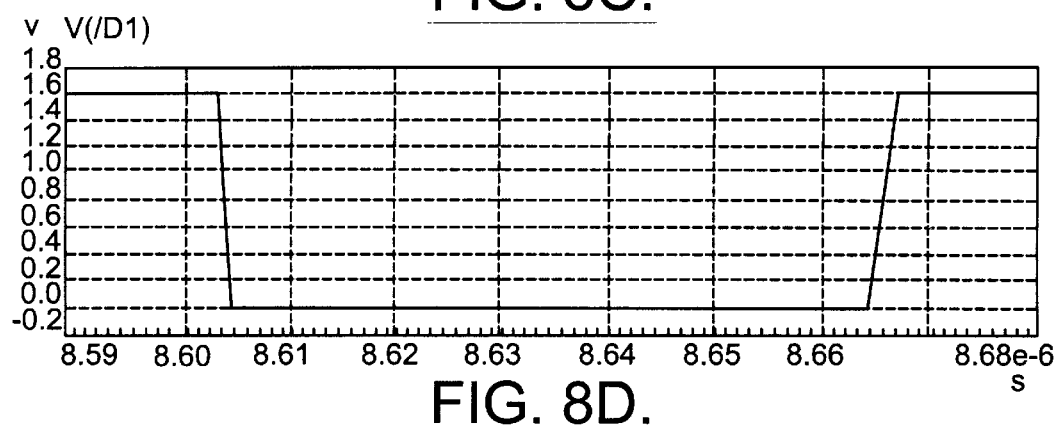
Figure 9A:
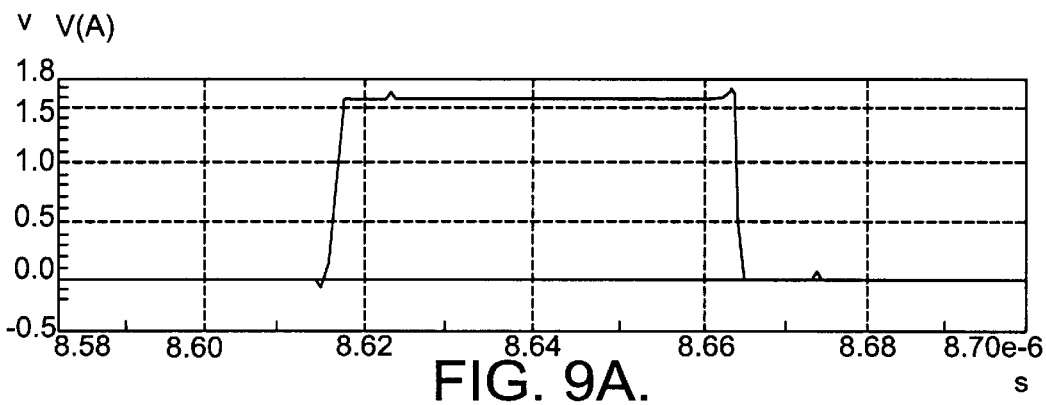
FIGS. 9A, 9B, 9C and 9D are respective schematic views of voltage-vs-time plots for signals which appear in the negative charge pump circuit of FIG. 6.
Figure 9B:
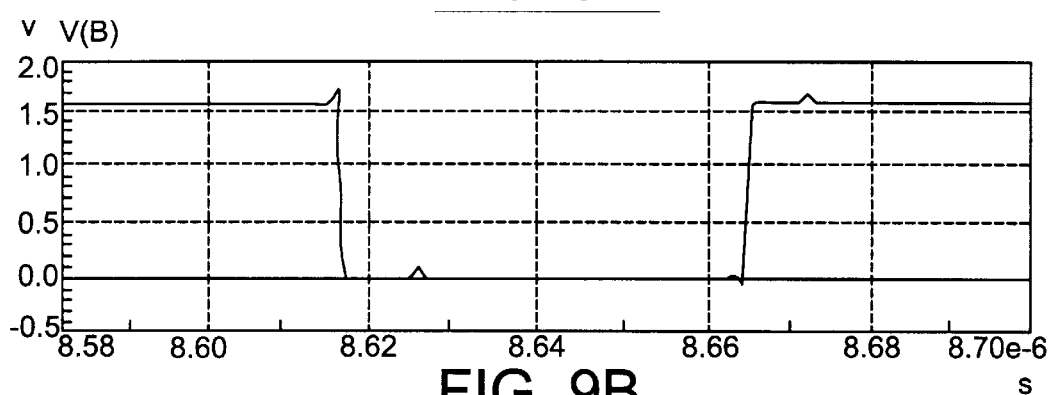
Figure 9C:
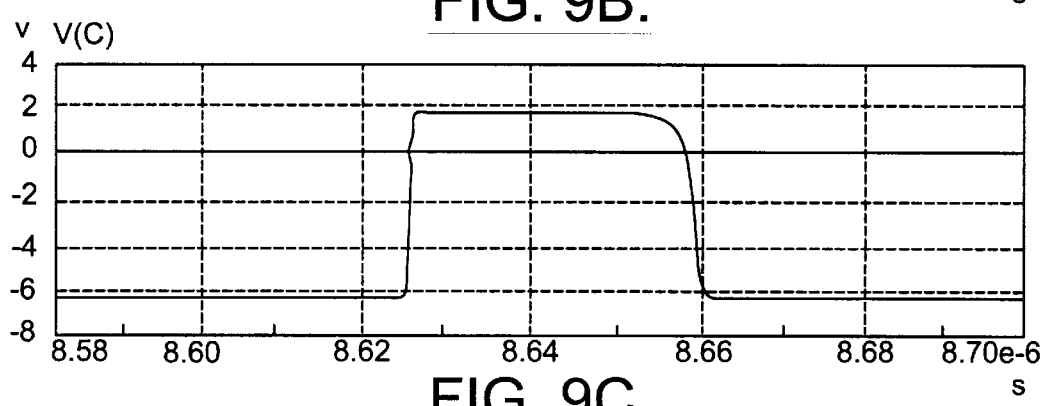
Figure 9D:
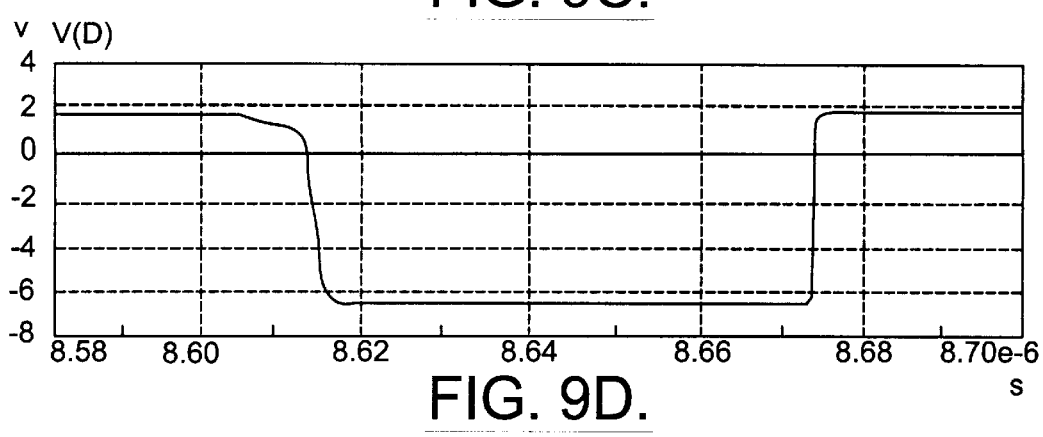

Referring to the drawing views, and in particular to FIG. 1, a charge pump circuit 1 according to the present invention is illustrated. The charge pump circuit 1 is useful with integrated memory devices such as EPROMs, EEPROMs, and Flash EEPROMs. The circuit 1 represents a positive charge pump. A modified embodiment illustrated in FIG. 6 provides a negative charge pump circuit 101 which also embodies the principles of the present invention.

The circuit 1 comprises a plurality n of stages which are cascade connected together between a supply voltage reference VDD and an output terminal OUT. In the preferred embodiment described herein by way of a non-limitative example, the circuit 1 comprises at least four stages, with each stage including a boost capacitor. A first stage comprises a high-voltage PMOS transistor M1 having its conduction terminals connected between the supply VDD and a terminating node of the stage designated STAGE1. The gate terminal of this transistor M1 receives a drive signal C from a drive circuit 10, which will be described below. The body terminal of the transistor M1 has applied thereto a bias voltage signal PW1. A first high-voltage boost capacitor C1 is connected to the terminal of the transistor M1 connected to the node STAGE1. The other end of the capacitor C1 receives a drive signal A.

The second stage of the charge pump circuit 1 comprises a second high-voltage PMOS transistor M2 which has its conduction terminals connected between the first node STAGE1 and a second node STAGE2. The gate terminal of the second transistor M2 receives a drive signal D from a drive circuit 10. The body terminal of the transistor M2 has applied thereto a bias voltage signal PW2. A second high-voltage boost capacitor C2 is connected to the terminal of the transistor M2 via the second node STAGE2. The other terminal of the capacitor C2 receives a drive signal B.

The third stage of the charge pump circuit 1 comprises a third high-voltage PMOS transistor M3 which has its conduction terminals connected between the second node STAGE2 and a third node STAGE3. The gate terminal of the third transistor M3 receives the drive signal C from the circuit 10. The body terminal of the transistor M3 is connected to the output terminal OUT of the circuit 1. A third high-voltage boost capacitor C3 is connected to the terminal of the transistor M3 via the third node STAGE3. The other terminal of the capacitor C3 receives the drive signal A simultaneously with the first capacitor C1.

The fourth stage of the charge pump circuit 1 comprises a fourth high-voltage PMOS transistor M4 which has its conduction terminals connected between the third node STAGE3 and a fourth node STAGE4. The gate terminal of the fourth transistor M4 receives the drive signal D from the circuit 10. The body terminal of the transistor M4 is also connected to the output terminal OUT of the circuit 1. A fourth high-voltage boost capacitor C4 is connected to the terminal of the transistor M4 via the fourth node STAGE4. The other terminal of the capacitor C4 receives the drive signal B simultaneously with the second capacitor C2.

A final stage of the charge pump circuit 1 comprises a fifth high-voltage PMOS transistor M5 which has its conduction terminals connected between the fourth node STAGE4 and the output terminal OUT. The gate terminal of the fifth transistor M5 receives the drive signal C from the circuit 10. The body terminal of the transistor M5 is also connected to the output terminal OUT of the circuit 1. A final high-voltage stabilization capacitor C5 is connected to the output terminal OUT. The other end of the capacitor C5 is connected to a ground voltage reference GND. The capacitor C5 is to attenuate ripple and fluctuations at the output terminal OUT.

The output terminal OUT of the circuit 1 is connected to a voltage divider 2 formed of a series of PMOS transistors M6, M7, M8 and M9. The last transistor M9 in the series has a conduction terminal connected to the supply VDD. The point of interconnection of transistors M7 and M8 is connected to ground via a high-voltage capacitor C7. The point of interconnection of the transistors M8 and M9 is connected to ground via a high-voltage capacitor C8. Advantageously, the divider 2 serves to generate voltages for biasing at least the n-wells of the transistors M1 and M2, as now explained. The division is performed between V(OUT) and VDD to obtain intermediate voltages to these values. This is carried out by the transistors M6 to M9, with the capacitors C6 to C8 functioning to stabilize the voltage values at the nodes to which they are connected.

In this way, voltages are selected which are sufficiently high to prevent forward biasing of the n-well/source and n-well/drain junctions. Forward biasing of voltages no larger than 0.6 V, which is the turn-on limit for a PN junction, can be tolerated. However, the voltage should not be too high so that the body effect can be limited as much as possible. A good trade-off is achieved by connecting the n-well of M2 to the signal PW2 pick-up node, and the n-well of M1 to the signal PW1 pick-up node. To further optimize the biasing of the pass transistor n-wells, in particular those of M1 and M2, the handling of their biasing can be further complicated by providing a different bias according to the value attained at the output OUT, or during the output transitions. In addition, the transistors from M6 to M9 should exhibit the least power consumption possible. Accordingly, their construction should be fairly resistive.

The operation of the charge pump circuit 1 of the present invention will now be described. The operating principle is straightforward, wherein the capacitors C1 to C4 function as boost capacitors. The objective is to cause positive charge to pass from the supply VDD to the output terminal OUT, and through the pass transistors M1 to M5. The charge will build up at the output terminal OUT.

The pass transistors should function as switches. When turned on, they are to allow the charge to flow from the i–Th stage to the (i+1)–Th stage. When turned off, they are to inhibit the charge from getting through in any amount. Advantageously, the capacitor driving signals A and B are in phase opposition with each other, as shown in FIGS. 4A to 4D. These signal can be passed simultaneously, and oscillate between ground GND and the supply VDD.

By having the phases of the signals A and B supplied from the voltage supply VDD, they deliver all the current that is required for driving the large boost capacitors C1 to C4. The PMOS pass transistors M1 to M5 are driven with a voltage at ground GND level (VDD) when these transistors are to be turned on, and a voltage equal to the highest of the positive output voltages involved when the transistors are to be turned off. The highest of the positive output voltages are provided by the output terminal OUT of the charge pump. The phases C and D driving the PMOS transistors M1 to M5 will oscillate between ground GND level and the voltage at the output terminal OUT.

Advantageously, the phases C and D are not expected to deliver any large amount of current since they are only to charge and discharge the parasitic capacitances seen from the gate terminals of the transistors M1, M3, M5 and the transistors M2, M4, respectively. The steady-state voltage values of the phases A, B, C and D over time are plotted in FIGS. 4A to 4D. For the circuit 1 to perform correctly, the phases should be mutually consecutive.

Through a first half-cycle, phase C should rise first, hereafter phases A and B can go across simultaneously and phase D should ultimately fall. Likewise, through the other half-cycle, phase D should rise first, hereafter phases A and B can go across simultaneously and phase C ultimately falls. This pattern has been selected for the phases to have the positive charge flow through the circuit 1 from the supply side to the output terminal, but not the opposite way. For example, when phase A is high and phase B is low, charge is being transferred from the node STAGE1 to the node STAGE2, and from the node STAGE3 to the node STAGE4. Accordingly, the pass transistors M2 and M4 between these stages should be turned on, and the other pass transistors M1, M3 and M5 turned off.

To prevent the charge from flowing to the supply VDD from the node STAGE1, or from the node STAGE3 to the node STAGE2, or from the output OUT to the node STAGE4, before phase A rises and phase B falls, the phase C should have gone high. The transistors M1, M3 and M5 have already been turned off. Furthermore, should phase D fall before the rising of phase A and the falling of phase B, M2 and M4 would be turned on and cause a charge to be transferred from the node STAGE2 to the node STAGE1, and from the node STAGE4 to the node STAGE3. Therefore, phase D falls after the transition of A and B. This pattern of the phases through the other half-cycle can be readily inferred from the foregoing.

Thus, with the phases being timed as above and supplied the specified values (VDD to A and B, and V(OUT) to C and D), positive charge passes from the supply VDD to the output terminal OUT. As the positive charge builds up at the terminating node OUT, its voltage increases and enables the circuit 1 to perform its voltage booster function. At each stage of the pump, the voltage is boosted a value equal to the supply VDD. Since in the diagram of FIG. 1 the number n of booster stages is four, and since the process starts from the supply VDD wherein the first transistor M1 is connected, the output voltage OUT obtained by the voltage booster shown in FIG. 1 will be:

$$V(OUT))max=(n+1)VDD=(1+4)VDD=5VDD \quad [1]$$

The number n of stages in the charge pump 1 may be any desired number according to the voltage needed and the current to be delivered. In the steady-state condition, where no current is drawn from the output terminal OUT, the pass transistors will be driven at the time they are to be turned on by a voltage VGS equal to VDD for M1, 2VDD for M2, 3VDD for M3, 4VDD for M4, and 5VDD for M5.

The drive voltage is very high on all transistors except the first transistor M1, which would be driven at worst by VGS equal to full VDD since one of its terminals is connected to VDD directly. Whereas its gate terminal is brought precisely to a ground value at start-up. To compensate for the small overdrive on the first transistor M1, and to some extent on the second transistor M2 as well, a higher aspect ratio (W/L) can be chosen for M2 than for the following pass transistors M3 to M5, and for M1 than for M2.

Figure 2A:
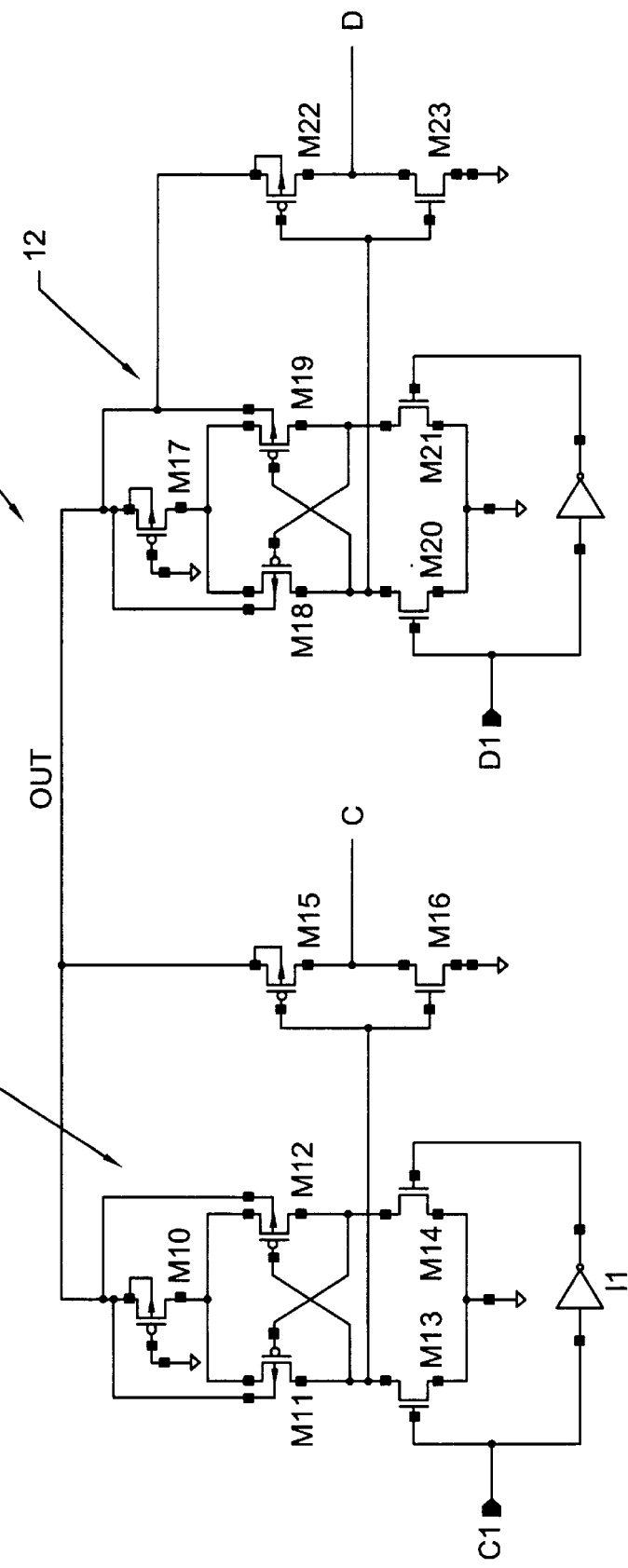
FIG. 2A is a schematic view of a drive circuit for the charge pump circuit of FIG. 1.

As previously mentioned, the phase signals A, B, C and D are generated by a drive circuit 10, shown schematically in FIG. 2A. The phases A, B, C and D are generated from four corresponding phases A1, B1, C1 and D1, as shown in FIGS. 3A to 3D. The phase signals A1, B1, C1 and D1 are generated by a specially provided circuit (not shown because it is conventional), and their timing is exactly like that described for phases A, B, C and D.

Figure 2B:
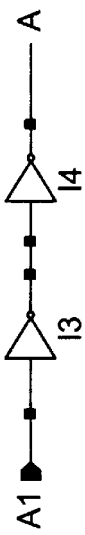
FIGS. 2B and 2C are respective schematic detail views of the drive circuit of FIG. 2A.
Figure 2C:
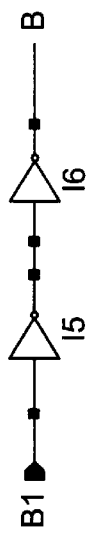

As for phases A and B, these are generated by applying the signals A1 and B1 to the inputs of respective buffer stages shown in FIGS. 2B and 2C. The signals A and B are to provide a large amount of current to get the large boost capacitors C1 to C4 started. The current is provided by the inverters I3, I4 for signal A, and the inverters I5 and I6 for signal B, as shown in FIGS. 2B and 2C.

As for phases C and D, these are obtained from the signals C1 and D1 by a level shift. C1 and D1 are supplied with VDD and initiated by the phase generation logic so that they will oscillate between ground GND and VDD. As previously explained, however, the transistors M1 to M5 are to be supplied phases from the output voltage V(OUT). Thus, the timing of phases C and C1 is the same as that of phases D and D1, but the voltage values are changed: VDD for C1 and D1, and V(OUT) for C and D.

The level shift is effected by the drive circuit 10 of FIG. 2A. A first level shifter 11 is provided for phase C, and has a differential cell structure comprising transistors M10 to M14 and an inverter I1. A second level shifter 12 is provided for phase D, and has a differential cell structure comprising transistors M17 to M21 and an inverter I2. The transistors M15 and M16 form an inverter with a buffer function, which is supplied from the node OUT and driven by the output from the level shifter 11. The output from the level shifter 11 is 0 (GND) when the signal C1 is a logic 1 (VDD). The output from the shifter 11 is V(OUT) when the signal C1 is a logic 0 (GND). The same conditions apply for the other phase signal D.

The structures of FIG. 2A for shifting the levels of phases C and D could be differently arranged. In all cases, they will draw current from the terminal OUT, regardless of their arrangement. In particular, this consumption will be due to the current needed to charge the parasitic capacitances brought about by the gates of the transistors M1 to M5 to be driven, and there may be crowbar current involved. By reason of this consumption, the output OUT is to deliver a current that will prevent it from attaining the maximum value given by relation [1].

Figure 5:
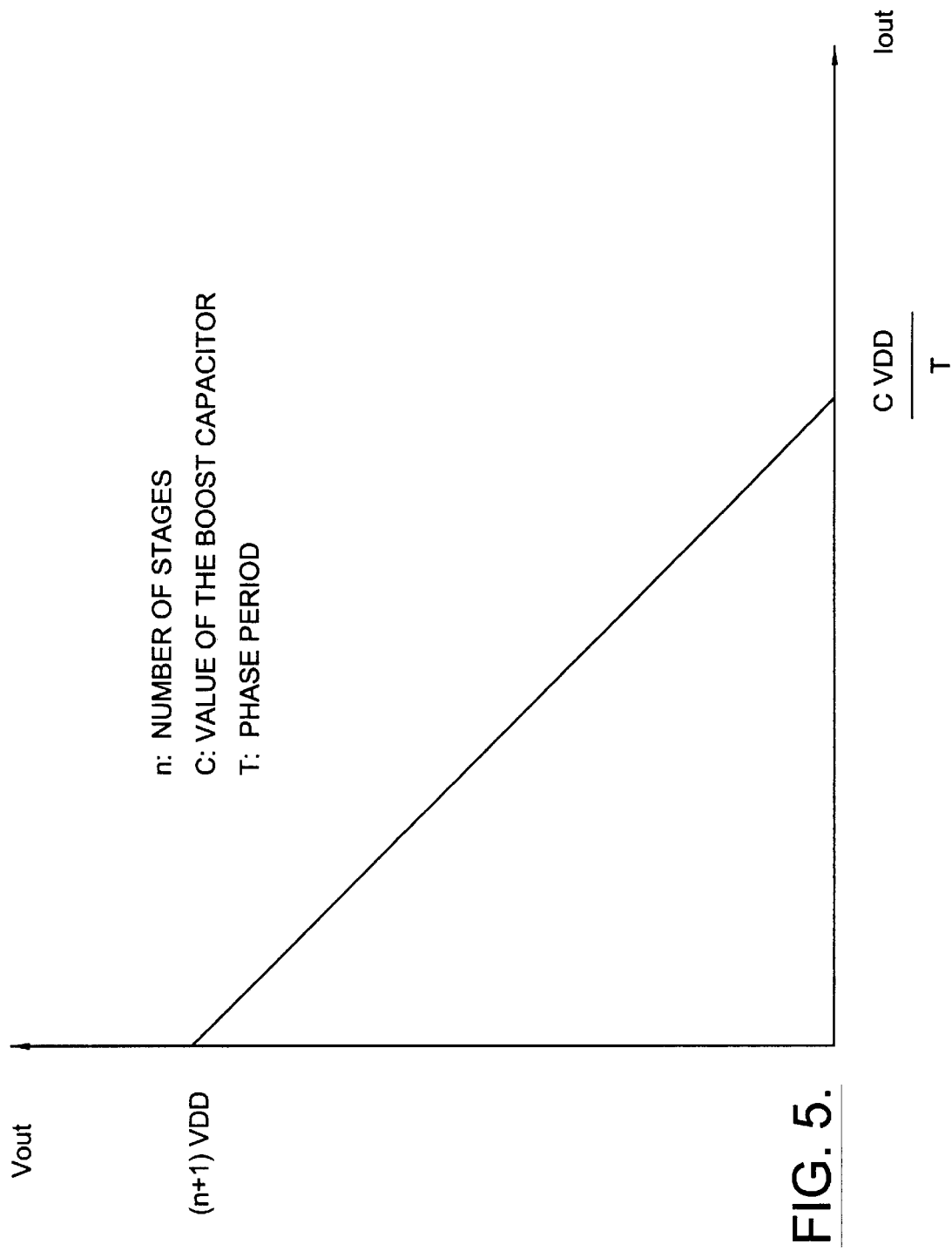
FIG. 5 is a schematic view of a voltage-vs-current characteristic plot for a positive charge pump circuit according to the present invention.

The voltage-current characteristic of a charge pump is of the type shown in FIG. 5. As the demand for output current increases, the output voltage decreases because positive current is being drawn at the output. The consumption from the structures of FIG. 2A, or their equivalents allowing the levels of phases C and D to be shifted, should be related to the amount of current that the charge pump of FIG. 1 can deliver, i.e., its voltage-current characteristic. The latter is dependent on the capacitances of the boost capacitors C1 to C4 used and the cycles of the phases A, B, C and D. The phase cycle is dependent on the characteristics of the PMOS transistors M1 to M5 used. All these factors determine by how much the output voltage V(OUT) will be lower with respect to relation [1]. For proper operation of the circuit of FIG. 1, the n-wells wherein the PMOS transistors are formed are biased.

It will be necessary to first bias the n-wells of transistors M1 to M5 correctly. This implies two aspects. A first aspect is that direct voltage drops between the N-well/source and N-well/drain junctions of the transistors should be prevented. A second aspect is that the body effect should be the least possible. These two aspects correspond to somewhat conflicting requirements since the first aspect involves biasing the n-well with the highest voltage obtained by the source or the drain of the transistor, i.e., a fairly high voltage. In contrast, the second aspect involves biasing the n-well with a voltage that does not exceed the highest voltage obtained by the source or the drain, i.e., a voltage not too high.

The difficulty of simultaneously meeting both the first and second aspects is that for each transistor M1 to M5, the source and drain are not defined because one of the two terminals will overtake the voltage of the other during a half-cycle of the phases, and have its role reversed during the other half-cycle. Moreover, from the time when the voltage booster is turned on to the time when the steady-state value is obtained, the voltages at all the booster nodes increase with time.

Since the highest voltage involved is the voltage V(OUT), to connect the n-wells of the transistors M3 to M5 to this voltage is to meet the first aspect as described above, but the second aspect is not fully met. However, this is not a serious problem since the voltage VGS that can be applied to these transistors is in all cases quite high. The overdrive VGS–VT is very high, despite VT being slightly higher than that with no body effect. The dependence of the threshold VT on the source/n-well voltage is that of a square root relation.

This does not hold true for the transistors M1 and M2, which are driven by a lower VGS. Accordingly, it will be necessary to lower the bias value of their n-wells. This value should be larger for M2 than for M1 because through the voltage booster, voltages increase from the i-Th stage to the (i+1)-Th stage. To generate the bias voltage for the n-wells of M1 and M2, the voltage may be split between V(OUT) and VDD to obtain intermediate voltages that can better meet the first and second aspects described above. This is achieved by transistors M6 to M9 of the divider 2, as previously described.

The approach proposed by the present invention does solve the technical problem, and affords a number of advantages as specified herein below. First, the minimum voltage VGS for driving the transistors is VDD (M1). Accordingly, only one transistor (M1) will not be driven well, with all the other transistors being driven with a very high VGS, such as: 2VDD for M2, 3VDD for M3, 4VDD for M4, and 5VDD for M5. Due to the consumption by the circuit of FIG. 2A, the output, and hence the intermediate stages STAGE, will exhibit a lower value than the ideal value.

The reduced overdrive on the first transistor (M1) can be accommodated by choosing a higher aspect ratio (W/L) for it than for the other transistors M2 to M5. This may also be done with M2, if desired. It should be further noted that even the worst driven transistor (M1) has a VGS equal to at least a full VDD. One of its terminals is connected to VDD directly, while its gate terminal is held at ground value GND at start-up. The overdrive problem encountered with conventional devices is, therefore, solved.

The last-mentioned aspect, that is, the ability to drive the pass function transistors with a higher VGS as compared to the traditional case, largely outweighs the disadvantage of a reduced mobility of holes relative to electrons, which is the cause for the conductivity of pmos being less than that of nmos. At very low supply voltages, the overdrive with which the transistors can be turned on, i.e., the voltage VGS-VT that can be applied to them, counts more than the transistor conductivities. Furthermore, the body effect problem is minimized, both by the way the n-wells of transistors M1 to M5 are biased, which almost fully removes the body effect and by the drive voltage VGS. In the presence of the weak residual body effect (which is high), a small increase in threshold bears virtually no influence. It should be further considered that the invention need not be practiced with triple-well technology.

Additional advantages of the present invention are the following:

a) The proposed circuit can also be operated on very low (<1.8 V) supply voltages. Exactly how low such voltages can be is dependent on the process used. In particular, the voltage is dependent on the threshold voltages of the PMOS transistors M1 to M5 used, their body effect, and their conductivity.

b) The circuit 1 can be made to output arbitrarily high positive values by simply selecting an appropriate number of stages.

c) Since the pass transistors are well driven, the phase cycles can be low (the charge transfer is more efficient), which increases the current that the voltage booster can deliver.

d) Although four phases are provided, two (A and B) of them can go across simultaneously. Thus, less overlaps between the various phases are needed than in conventional four-phase voltage boosters. As a result, the phase cycles can be lower, thereby ensuring that a larger current can be delivered.

Changes and modifications can be made to the circuit of this invention within the scope of the appended claims.

Another embodiment is a negative charge pump with NMOS transistors. This is done by applying the same principle to obtain almost the same advantages as with the previously described embodiment.

In this respect, reference is now directed to FIGS. 6, which illustrates a modified embodiment of the circuit of FIG. 1. The stages only include NMOS transistors and the first transistor in the series is connected to the ground voltage reference. The drive circuitry for generating the bias signals PW1 and PW2 to the p-wells of the NMOS transistors have been omitted for simplicity. The implementation of the drive circuit for generating the phases A, B, C and D replicates that described in relation to FIGS. 2A, 2B and 2C.

That which is claimed is:

1. A charge pump circuit for an integrated memory device comprising:
   a plurality of stages cascade connected between an input terminal at a first voltage reference and an output terminal, said plurality of stages comprising a first stage, a last stage and at least one intermediate stage therebetween, said at least one intermediate stage comprising
   a transistor having a pair of conduction terminals connected between a previous stage and a next stage, and a control terminal receiving a drive signal, and
   a boost capacitor connected to one of the conduction terminals of said transistor.

2. A charge pump circuit according to claim 1, wherein said transistor comprises a P-channel MOSFET.

3. A charge pump circuit according to claim 1, wherein said transistor comprises an N-channel MOSFET.

4. A charge pump circuit according to claim 1, wherein said boost capacitor has one terminal connected to an interconnection node between adjacent connected stages, and another terminal receiving a phase signal; and wherein boost capacitors of said adjacent connected stages receive phase signals having an opposing phase.

5. A charge pump circuit according to claim 1, wherein transistors of odd-numbered stages have their control terminals driven by a first common phase signal.

6. A charge pump circuit according to claim 1, wherein transistors of even-numbered stages have their control terminals driven by a second common phase signal.

7. A charge pump circuit according to claim 1, wherein the first stage comprises a transistor having a body terminal biased with a first predetermined voltage.

8. A charge pump circuit according to claim 1, wherein the first stage comprises a transistor having a body terminal biased with a first predetermined voltage; and wherein said transistor of at least a second stage of said at least one intermediate stage comprises a body terminal biased with a second predetermined voltage.

9. A charge pump circuit according to claim 1, further comprising a voltage divider connected between the output terminal and the input terminal.

10. A charge pump circuit according to claim 9, wherein the first stage comprises a transistor having a body terminal biased with a first predetermined voltage provided by said voltage divider.

11. A charge pump circuit according to claim 9, wherein the first stage comprises a transistor having a body terminal biased with a first predetermined voltage provided by said voltage divider; and wherein said transistor of at least a second stage of said at least one intermediate stage comprises a body terminal biased with a second predetermined voltage provided by said voltage divider.

12. A charge pump circuit according to claim 1, wherein the last stage comprises a transistor and said transistor of a next to last stage of said at least one intermediate stage each comprises a body terminal connected to the output terminal.

13. A charge pump circuit according to claim 1, wherein the last stage comprises a capacitor connected between the output terminal and a second voltage reference.

14. A charge pump circuit according to claim 1, wherein the first stage comprises a transistor having a channel with a length to width ratio defining a first aspect ratio, a channel of said transistor of a second stage of said at least one intermediate stage has a length to width ratio defining a second aspect ratio less than the first aspect ratio, and channels of transistors of remaining stages of said at least one intermediate stage have a length to width ratio defining a third aspect ratio less than the second aspect ratio.

15. A charge pump circuit according to claim 1, wherein the control terminal of said transistor has a first voltage equal to ground when said transistor is turned on, and a second voltage equal to a voltage present at the output terminal when said transistor is turned off.

16. A memory device comprising:
a plurality of cells;
a charge pump circuit providing a pumped voltage to said plurality of cells, said charge pump circuit comprising
a plurality of stages cascade connected between an input terminal and an output terminal, said plurality of stages comprising a first stage, a last stage and at least one intermediate stage therebetween, said at least one intermediate stage comprising
a transistor having a pair of conduction terminals connected between a previous stage and a next stage, and a control terminal receiving a drive signal, and
a boost capacitor connected to one of the conduction terminals of said transistor.

17. A memory device according to claim 16, wherein said transistor comprises a P-channel MOSFET.

18. A memory device according to claim 16, wherein said transistor comprises an N-channel MOSFET.

19. A memory device according to claim 16, wherein said boost capacitor has one terminal connected to an interconnection node between adjacent connected stages, and another terminal receiving a phase signal; and wherein boost capacitors of said adjacent connected stages receive phase signals having an opposing phase.

20. A memory device according to claim 16, wherein transistors of odd-numbered stages have their control terminals driven by a first common phase signal.

21. A memory device according to claim 16, wherein transistors of even-numbered stages have their control terminals driven by a second common phase signal.

22. A memory device according to claim 16, wherein the first stage comprises a transistor having a body terminal biased with a first predetermined voltage.

23. A memory device according to claim 16, wherein the first stage comprises a transistor having a body terminal biased with a first predetermined voltage; and wherein said transistor of at least a second stage of said at least one intermediate stage comprises a body terminal biased with a second predetermined voltage.

24. A memory device according to claim 16, further comprising a voltage divider connected between the output terminal and the input terminal.

25. A memory device according to claim 24, wherein the first stage comprises a transistor having a body terminal biased with a first predetermined voltage provided by said voltage divider.

26. A memory device according to claim 24, wherein the first stage comprises a transistor having a body terminal biased with a first predetermined voltage provided by said voltage divider; and wherein said transistor of at least a second stage of said at least one intermediate stage comprises a body terminal biased with a second predetermined voltage provided by said voltage divider.

27. A memory device according to claim 16, wherein the last stage comprises a transistor and said transistor of a next to last stage of said at least one intermediate stage each comprises a body terminal connected to the output terminal.

28. A memory device according to claim 16, wherein the last stage comprises a capacitor connected between the output terminal and a second voltage reference.

29. A memory device according to claim 16, wherein the first stage comprises a transistor having a channel with a length to width ratio defining a first aspect ratio, a channel of said transistor of a second stage of said at least one intermediate stage has a length to width ratio defining a second aspect ratio less than the first aspect ratio, and channels of transistors of remaining stages of said at least one intermediate stage have a length to width ratio defining a third aspect ratio less than the second aspect ratio.

30. A memory device according to claim 16, wherein the control terminal of said transistor has a first voltage equal to ground when said transistor is turned on, and a second voltage equal to a voltage present at the output terminal when said transistor is turned off.

31. A method for generating a voltage greater than a supply voltage in an integrated memory device provided with a single supply voltage using a charge pump circuit comprising a plurality of stages cascade connected between an input terminal and an output terminal, the plurality of stages comprising a first stage, a last stage and at least one intermediate stage therebetween, the at least one intermediate stage comprising a transistor having a pair of conduction terminals connected between a previous stage and a next stage, and a boost capacitor connected to one of the conduction terminals of the transistor, the method comprising the steps of:
applying a drive signal to a control terminal of each transistor for passing a voltage through each stage from the input terminal to the output terminal; and
operating each boost capacitor for generating a voltage equal to a first voltage reference so that the voltage passed by each stage is cumulatively increased by an amount equal to the first reference voltage.

32. A method according to claim 31, wherein the transistor comprises a P-channel MOSFET.

33. A method according to claim 31, wherein said transistor comprises an N-channel MOSFET.

34. A method according to claim 31, wherein each boost capacitor has a first terminal connected to an interconnection node between adjacent connected stages; the method further comprising the step of providing a phase signal to a second terminal of each boost capacitor, with the phase signals applied to the boost capacitors of adjacent connected stages receiving phase signals having an opposing phase.

35. A method according to claim 31, further comprising the step of driving the control terminals of transistors of odd-numbered stages by a first common phase signal.

36. A method according to claim 31, further comprising the step of driving the control terminals of transistors of even-numbered stages by a second common phase signal.

37. A method according to claim 31, wherein the first stage comprises a transistor having a body terminal; the method further comprising the step of biasing the body terminal with a first predetermined voltage.

38. A method according to claim 31, wherein the first stage comprises a transistor having a body terminal, a transistor of at least a second stage of the intermediate stages comprises a body terminal; the method further comprising the steps of:

biasing the body terminal of the first stage transistor with a first predetermined voltage; and biasing the body terminal of the second stage transistor with a second predetermined voltage.

39. A method according to claim 31, wherein the charge pump circuit further comprises a voltage divider connected between the output terminal and the first voltage reference, and wherein the first stage comprises a transistor having a body terminal; the method further comprising the step of biasing the body terminal with a first predetermined voltage with a first predetermined voltage provided by the voltage divider.

40. A method according to claim 31, wherein the charge pump circuit further comprises a voltage divider connected between the output terminal and the first voltage reference, and wherein the first stage comprises a transistor having a body terminal, a transistor of at least a second stage of the intermediate stages comprises a body terminal; the method further comprising the steps of:

biasing the body terminal of the first stage transistor with a first predetermined voltage; and biasing the body terminal of the second stage transistor with a second predetermined voltage.

41. A method according to claim 31, wherein the last stage comprises a transistor and a transistor of a next to last stage of the at least one intermediate stage each comprises a body terminal; the method further comprising the step of connecting the body terminals to the output terminal.

42. A method according to claim 31, further comprising the steps of:

applying a first voltage equal to ground to the control terminal of each transistor when turned on; and applying a second voltage equal to a voltage present at the output terminal to the control terminal of each transistor when turned off.

* * * * *

UNITED STATES PATENT AND TRADEMARK OFFICE
CERTIFICATE OF CORRECTION

PATENT NO. : 6,163,487
DATED : December 19, 2000
INVENTOR(S) : Andrea Ghilardelli Page 1 of 2

It is certified that error appears in the above-identified patent and that said Letters Patent is hereby corrected as shown below:

<u>Title page,</u>
Item [30] Foreign Application Priority Data insert -- Aug. 27, 1998 [IT] Italy..........................MI98A001930 --

Figure 4A:
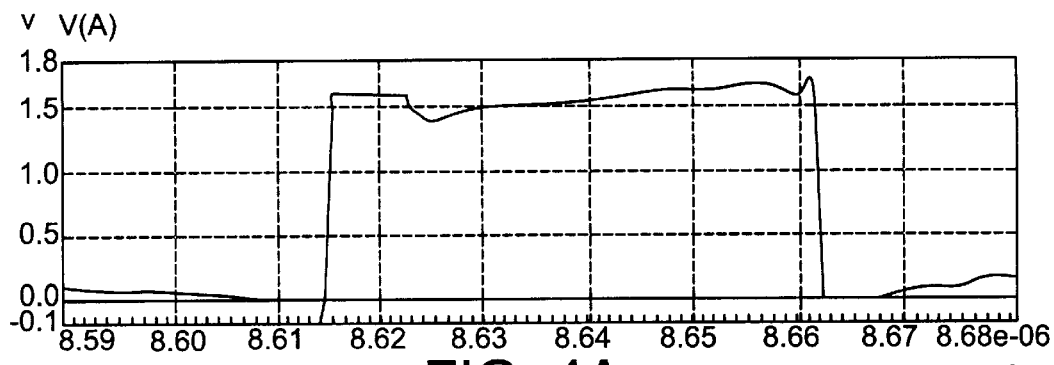
FIGS. 4A, 4B, 4C and 4D are respective schematic views of voltage-vs-time plots for signals which appear in the positive charge pump circuit according to the present invention.

<u>Drawings,</u>
FIG. 4A, delete FIG. 4A insert -- new FIG. 4A --

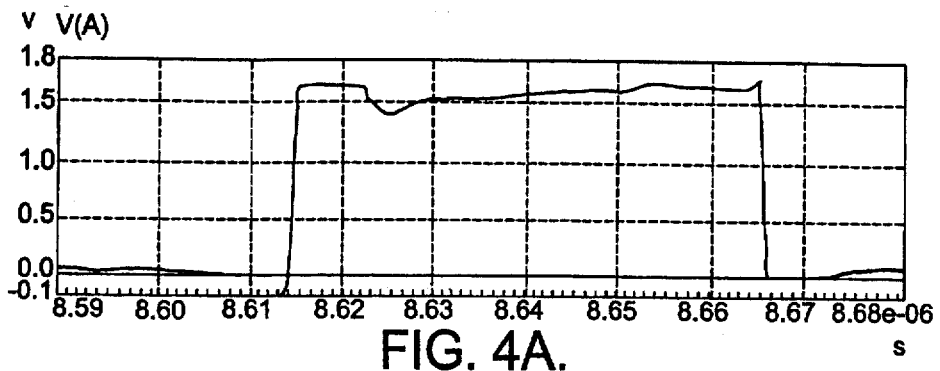

Figure 4B:
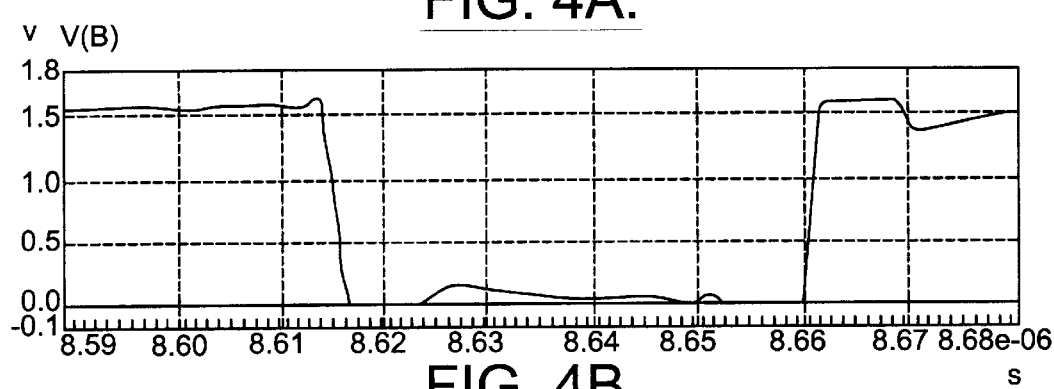
Figure 4C:
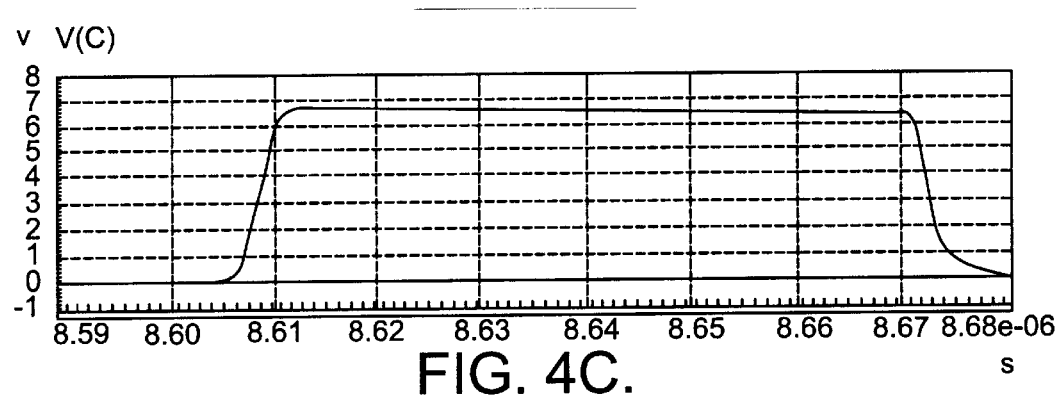
Figure 4D:
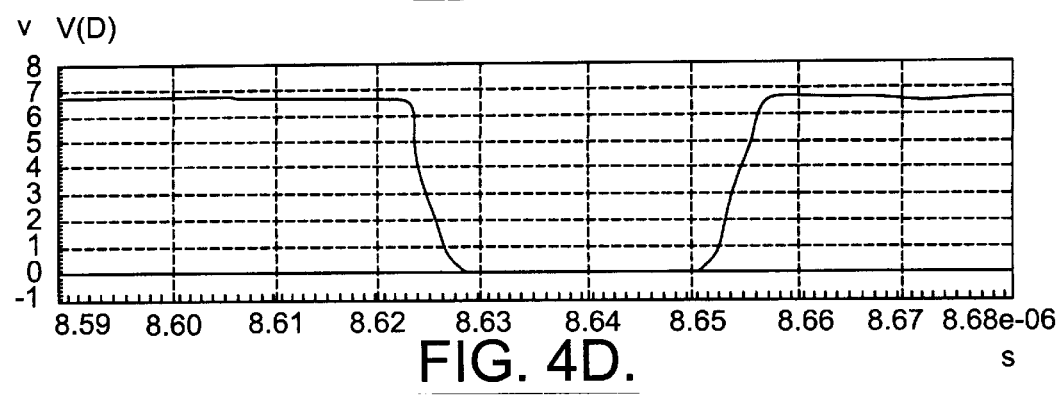

FIG. 4B, delete FIG. 4B insert -- new FIG. 4B --

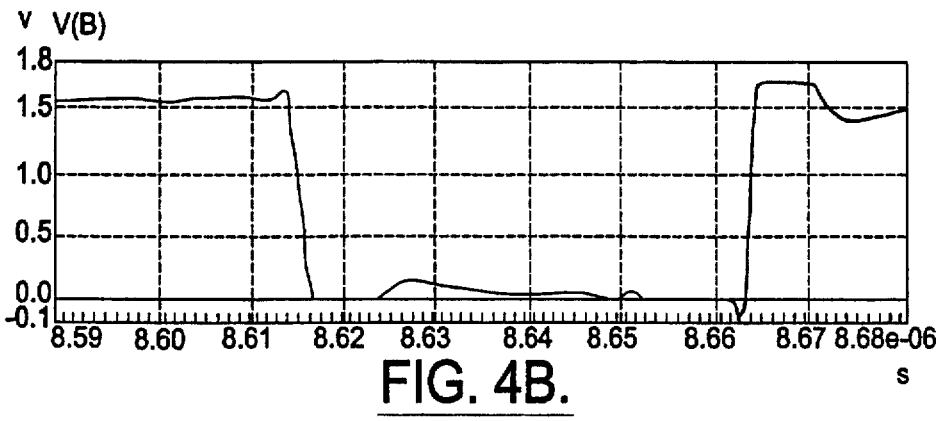

UNITED STATES PATENT AND TRADEMARK OFFICE
CERTIFICATE OF CORRECTION

PATENT NO. : 6,163,487
DATED : December 19, 2000
INVENTOR(S) : Andrea Ghilardelli It is certified that error appears in the above-identified patent and that said Letters Patent is hereby corrected as shown below:

Drawings,
FIG. 7A, delete FIG. 7A insert -- new FIG. 7A --

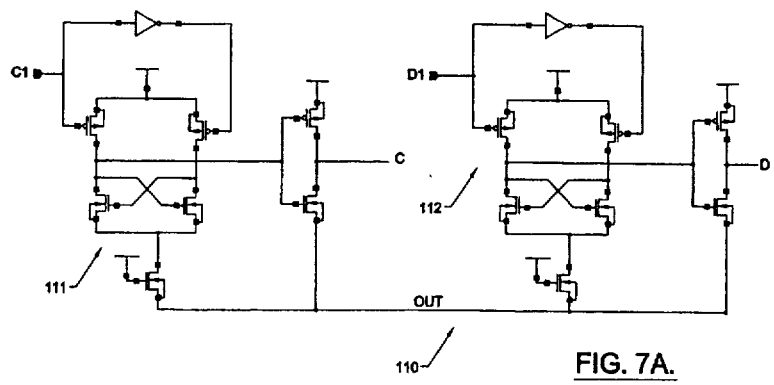

FIG. 7A.

Column 4,
Line 25, delete "signal" insert -- signals --

Signed and Sealed this

Twenty-seventh Day of November, 2001

Attest:

NICHOLAS P. GODICI
Attesting Officer    Acting Director of the United States Patent and Trademark Office